United States Patent [19]

Franz et al.

[11] 4,161,775

[45] Jul. 17, 1979

[54] RECTIFIER UNIT FOR PROVISION IN AN ALTERNATOR

[75] Inventors: Herbert Franz, Stuttgart; Reinhold Wamsler, Schwieberdingen; Georg Binder, Stuttgart, all of Fed. Rep. of Germany

[73] Assignee: Robert Bosch GmbH, Stuttgart, Fed. Rep. of Germany

[21] Appl. No.: 841,708

[22] Filed: Oct. 13, 1977

[30] Foreign Application Priority Data

Oct. 29, 1976 [DE] Fed. Rep. of Germany ....... 2649418

[51] Int. Cl.² ...................... H02M 1/00; H02K 11/00
[52] U.S. Cl. ..................................... 363/145; 363/141; 310/68 D
[58] Field of Search ....................... 363/141, 144, 145; 310/68 R, 68 D

[56] References Cited

U.S. PATENT DOCUMENTS

| | | | |
|---|---|---|---|
| 3,548,226 | 12/1970 | Sato | 310/68 |
| 3,629,630 | 12/1971 | Cotton et al. | 310/68 |
| 3,789,275 | 1/1974 | Sawano et al. | 363/145 X |
| 3,831,062 | 8/1974 | Haug et al. | 363/145 X |
| 3,895,247 | 7/1975 | Iwata et al. | 363/145 X |

*Primary Examiner*—William M. Shoop
*Assistant Examiner*—Peter S. Wong
*Attorney, Agent, or Firm*—Frishauf, Holtz, Goodman & Woodward

[57] ABSTRACT

A cooling plate of the unit is connected to each of the a.c. terminals of the alternator and each cooling plate carries the positive-side diode or diodes, the negative-side diode or diodes and the excitor field diode connected to that a.c. terminal. The cooling plates are mounted on a shaped insulating disk in which wires are embedded for connecting together the connection leads of the diodes. Provision is made for bringing out terminals for the connection of a regulator unit and for bringing out a terminal for one a.c. phase, as well as for attachment of the d.c. output terminals.

14 Claims, 8 Drawing Figures

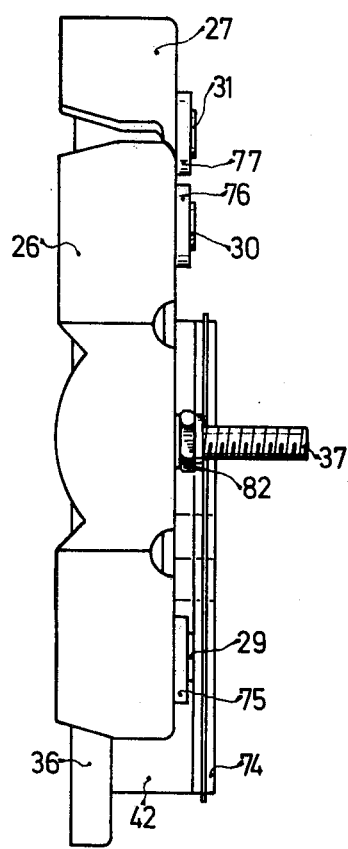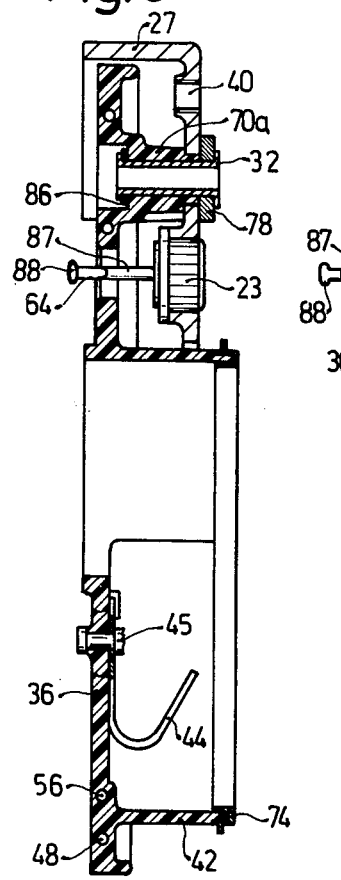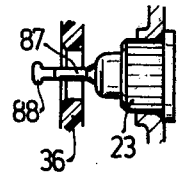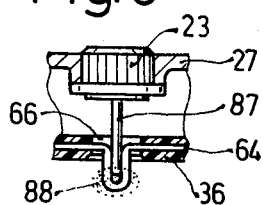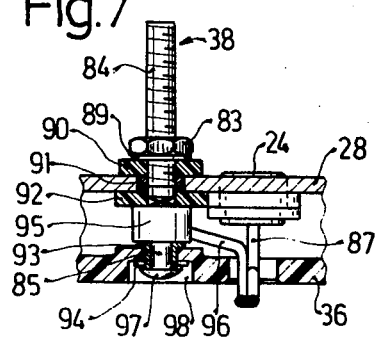

RECTIFIER UNIT FOR PROVISION IN AN ALTERNATOR

This invention relates to a rectifier unit for an alternator having formed metal cooling plates, on which diodes are mounted, and mechanically assembled with an insulating plate on which conductor paths for connecting up the diodes are provided, the whole assembly being mounted on or in the casing of an alternator, usually a 3-phase alternator of a motor vehicle.

BACKGROUND AND PRIOR ART

Various types of rectifier units, including among others, rectifier units for motor vehicle alternators, are known. In the known generators that are made in cylindrical shape, the rectifier units have been provided in the general form of a circular disk, usually with a central opening for the alternator shaft.

One of the known rectifier units is described in German published patent application (AS) 1,916,237, in which the positive-side diodes are mounted on one cooling body of the form of a cooling plate and the negative-side diodes are mounted on another such cooling body, the cooling plates taking the shape of an inner and an outer concentric sheet metal ring, both affixed to an insulating plate provided for carrying electrical connection elements.

U.S. Pat. No. 3,789,285 and the corresponding German published patent application (AS) 2,247,627 disclose a rectifier unit in which cooling plates are provided in the shape of circular sectors, one carrying the positive-side diodes and the other the negative-side diodes, the cooling plates being affixed to an insulating plate carrying the necessary connection conductors. The connecting up of the diodes in this case is provided by a patterned metal sheet that is cast into the insulating plate.

Finally, German Pat. No. 2,250,557 discloses a rectifier unit in which the positive-side diodes in one case and the negative-side diodes in another are each fastened to an annular disk-shaped cooling plate, the two plates being superimposed and insulated in sandwich construction and each having at its ends claw-shaped extensions.

These known rectifier units have the common disadvantage that the positive-side diodes are arranged on one cooling plate and the negative-side diodes on another, while the exciter field diodes are in every one of these constructions separate and must be soldered on the insulatingly affixed conductor plate. This requires an additional sequence of operations in manufacture and also involves risk of disturbances in operation, since under vibration and shaking of the generator the exciter field diodes can become loose from the insulating plate that carries the circuit.

Furthermore, in the case of alternators of higher ratings, substantial quantities of heat must be dissipated even from the excitor field diodes. It has therefore been proposed for alternators of higher ratings, for example in utility vehicles, to provide multiple cooling body systems in which an individual cooling body is provided for the exciter field diodes, which can be provided, for example, by a light metal injection molding.

THE PRESENT INVENTION

It is an object of the present invention to provide a rectifier unit in which the cooling bodies are more efficiently used for cooling all the rectifiers of the rectifier unit.

Briefly, the cooling bodies are electrically connected, preferably by firmly threading the connection cables into the cooling bodies, to the alternating current output terminals of the alternator, which means in the case of a 3-phase alternator, such as is commonly used in motor vehicles, that three cooling bodies are provided and that none of them is connected, as was common in the prior art, to one or another of the d.c. terminals of the rectifier. Thus, one of the exciter field diodes is mounted on each of the cooling bodies along with one or more of the output rectifier diodes. This arrangement enables all of the diodes to be effectively cooled in an efficient and economically manufacturable arrangement. The cooling bodies can be readily made of sheet metal and the expense of assembly can be substantially reduced by various features which have been found possible in applying the above concept.

The cooling bodies naturally have the shape of circular segments and their outer edges can be bent over at a right angle in claw-like fashion, so that the cooling surface can be increased with only insignificant increase of the outer dimensions of the rectifier unit. Furthermore, it is possible to mount instead of in each case one rectifier and one exciter field diode, two or more rectifier diodes and/or two or more exciter field diodes on each cooling body, each set of rectifier diodes and each set of exciter field diodes, where more than one is mounted on each cooling plate, having parallel connections of the diodes of a set. The use of parallel-connected diodes in many cases makes possible the use of diodes of smaller dimensions in a space-saving arrangement for rectifier units designed for heavy loads.

It is particularly convenient in such a construction to provide contact for a terminal connected to one phase of the alternator from which generator speed information can be obtained that is useful in motor vehicles for other apparatus, for example for speed control or regulation.

Such a terminal of the rectifier unit for the phase winding of the generator can be provided by fastening a threaded member to a cooling plate firmly with a nut, just as a firm releasable connections can be provided between the alternator windings and the rectifier unit by threaded fastenings to the respective cooling plates.

The insulating plate on which the cooling plates are mounted is preferably in the basic form of a circular disk and has a wall enclosing a large part of the circumference of a central hole in the circular disk extending on the cooling plate side of the disk in a keyhole contour which encloses, in the quadrant not occupied by one of the three cooling plates, a leaf spring connection for a regulator unit.

DRAWINGS

The invention is further described by way of illustrative example with reference to the annexed drawings, in which:

FIG. 4 is a side view of the embodiment shown in FIG. 2;

FIG. 5 is a section along the line A—A of FIG. 2;

FIG. 6 is a section along the line B—B of FIG. 2, and

FIG. 7 is a section of the embodiment of FIG. 2 along the line C—C.

Figure 1:
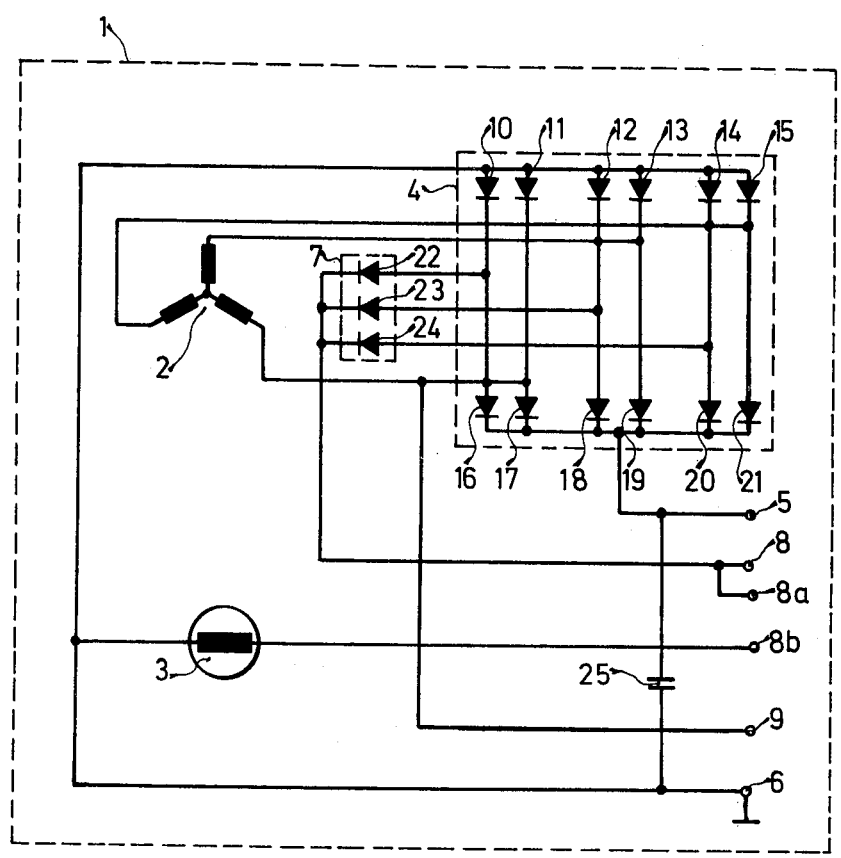
FIG. 1 is a circuit diagram of a rectifier unit to which the invention is applied.

FIG. 1 shows the electrical circuit of an alternator 1 of a motor vehicle that contains a rectifier unit according to the invention. The alternator is symbolized by the stator windings 2 that in the usual way are designated with the letters U,V and W, and a field winding 3 that is located in the rotor of the alternator. The stator windings U,V and W are connected together in the star configuration. Their alternating current outputs are connected to a bridge rectifier 4 and also to an additional rectifier 7. The d.c. voltage output of the bridge rectifier 4 is supplied to a positive terminal 5 and to a grounded negative terminal 6. Although it is common in the case of motor vehicles to connect the negative terminal 6 of the rectifier to chassis ground, it is of course possible to utilize the rectifier unit according to the present invention in an arrangement in which the negative terminal 6 is insulated rather than grounded to the chassis.

The d.c. output voltage of the additional rectifier 7 consisting of the excitor circuit diodes (22,23, and 24) is connected to terminals 8 and 8a designated for connection of a voltage regulator. The voltage regulator is not a part of the rectifier unit of the present invention, but may be located within or on the alternator. Suitable regulators are disclosed, for instance, in the copending patent applications of Ser. No. 834,000, filed Sept. 16, 1977, now U.S. Pat. No. 4,143,313 and Ser. No. 837,990, filed Sept. 29, 1977 (Armin Arend), now U.S. Pat. No. 4,129,819, corresponding to German patent applications P 26 44 643.5 and P 26 49 306.1, owned by the assignee of the present invention.

The field winding 3 is connected between the negative terminal 6 and the regulator connection terminal 8b. The various current-consuming devices of the motor vehicle can be connected between the positive terminal 5 and the negative terminal 6 which are also bridged by a disturbance filtering capacitor 25. The voltage regulator already mentioned will be connected between the regulator connection terminals 8 and 8b in the usual way that need not be further described here. The regulator terminal 8a is utilized in a known way with the ignition switch and the charging indicator lamp of the motor vehicle, as illustrated, for example, in the above-identified copending patent application Ser. No. 834,000, now U.S. Pat. No. 4,143,313. The voltage appearing at the terminal of the phase W of the alternator is brought out to an output terminal 9, at which a signal can be obtained that has a frequency proportional to the speed of rotation of the motor vehicle engine. Such signals are for example used for speed indication and for speed limiting or control in motor vehicles.

The bridge rectifier 4 consists of negative-side diodes 10 to 15 and positive-side diodes 16 to 21. For each phase of the 3-phase alternator, a pair of negative-side diodes and a pair of positive-side diodes are provided, for example for the phase W, the negative-side diodes 10 and 11 and the positive-side diodes 16 and 17. In this manner at high current loads, operation with two diodes of half the current-carrying capacity is obtained instead of with one diode of the full current-carrying capacity that would have substantially larger dimensions. In addition, the two-diode arrangement has the advantage that upon failure of a single diode, the rectifier still remains capable of operation at light current loads.

Figure 2:
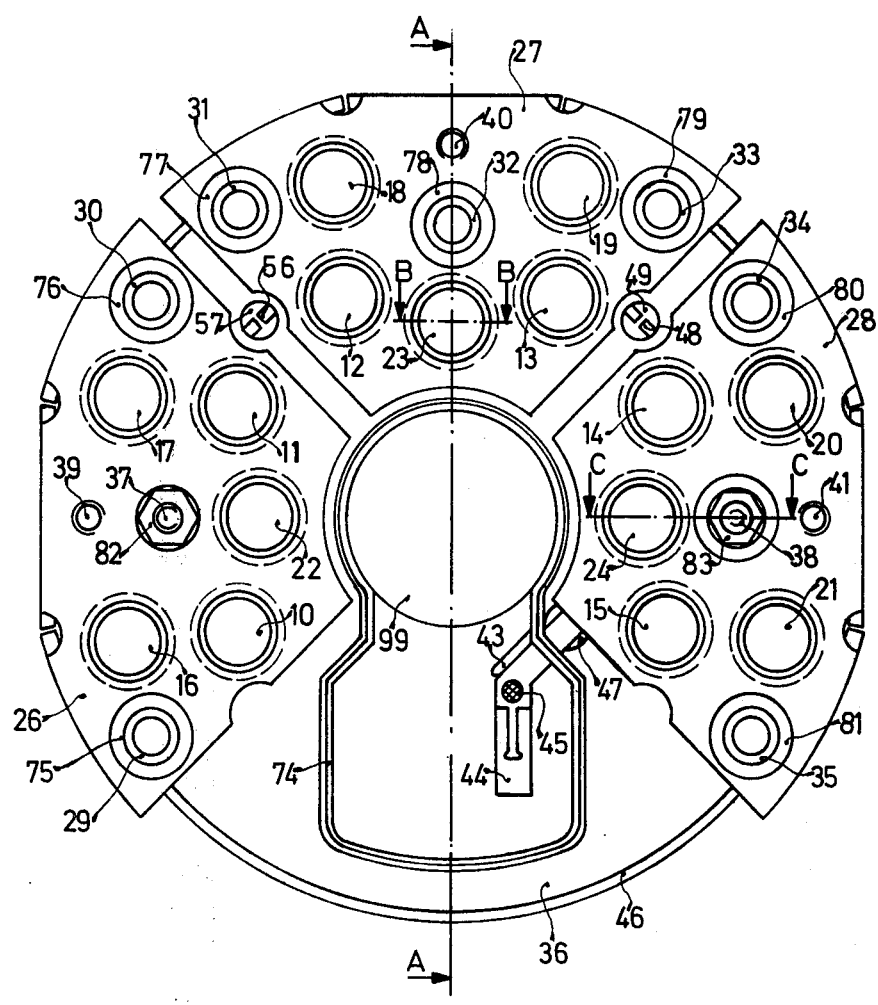
FIG. 2 is a top plan view of a rectifier unit embodying the invention.

FIG. 2 shows an illustrative embodiment of the rectifier unit of the present invention, in this case in plan view. A first cooling body (heat sink) 26, a second cooling body 27 and a third cooling body 28, each having the form of a sector-shaped portion of a circle or annulus, are fastened by rivets 29 to 35 and insulating washers 75 to 81 on an essentially round insulating conductor-carrying plate 36. In the first cooling body 26, the diodes 10,11,16,17 and 22 are pressed into their places; in the second cooling body 27, likewise the diodes 12,13,18,19 and 23, and in the third cooling body 28, likewise the diodes 14,15,20,21 and 24. In the first cooling body 26, a threaded stud 37 is screwed fast by means of a nut 82 to provide an electrically conducting and mechanically untwistable connection. In the third cooling body 28, a threaded stud 38 is screwed fast by means of a nut 83 to provide a mechanically rigid mounting that keeps the stud 38 insulated from the cooling body 28. The cooling bodies 26,27 and 28 each have a third bore, respectively 39,40 and 41, near their outer edges, by means of which cable ends having a suitable terminal fitting can be screwed into the cooling bodies so as to connect the cooling body 26 with the phase W, the cooling body 27 with the phase V and the cooling body 28 with the phase U of the alternator. The diodes 10 and 11 pressed into the cooling body 26 are of a construction in which the cathode of the diodes is connected with the diode casing. In the case of the diodes 16 and 17 and of the exciter circuit diode 22, the diodes are of the kind in which the anode is connected with the diode casing. In a similar way, the cooling bodies 27 and 28 are equipped with diodes in which in the manner described the anode or the cathode is connected with the diode casing.

The approximately circular insulating plate 36, preferably made of polyamide resin, has a circular passage hole 99 in its center which is surrounded for a major portion of its circumference by a collar-like ridge 42 in keyhole fashion. The summit of the ridge 42 is capped by a sealing member 74 that fits over its tip profile and contour. The ridge 42 leads away from the circumference of the hole 99 for a certain part of that circumference and bounds an approximately rectangular surface of the insulating plate 36 of which one end adjoins the hole 99. Within this surface, there is mounted a leaf spring 44 that has a narrow foot with an end portion that goes off at an angle, this foot lying on the insulating plate 36. As shown in FIG. 5, however, the end of the foot of the leaf spring 44 is arcuate, bowed away from the insulating plate 36. The foot of the leaf spring 44 is fastened to the insulating plate 36 by means of a stud 45. The part of the foot that goes off at an angle lies against a small raised rib 43 of the insulating plate 36, so that the leaf spring is thereby arrested. The end of the angularly extending portion of the foot passes under the ridge 42 and extends on the other side thereof to a location over a bore 47 in the insulating plate 36.

Figure 3:
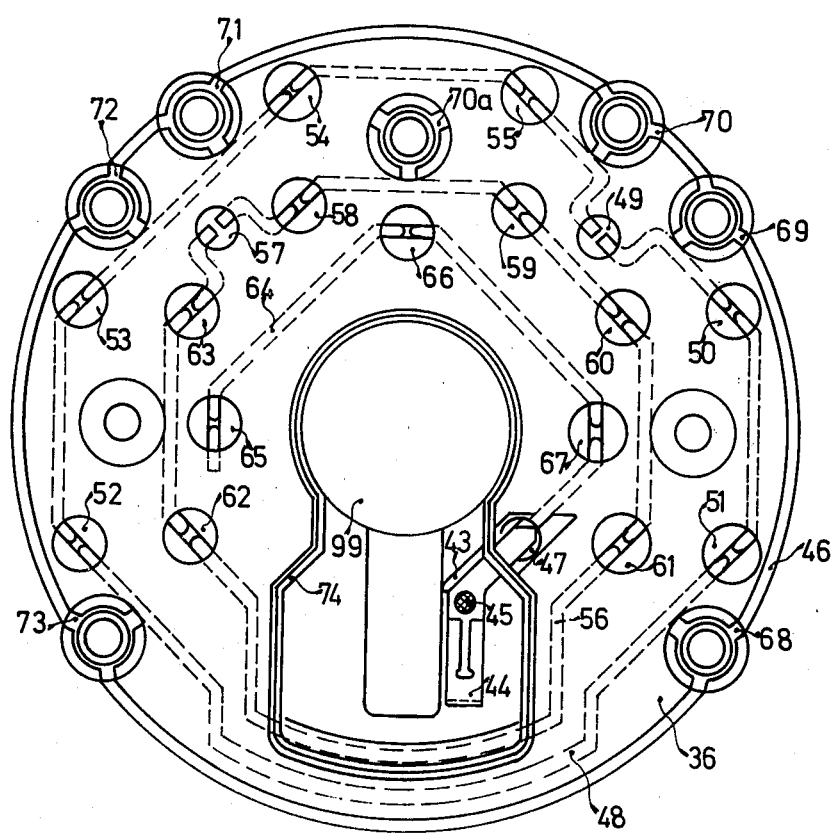
FIG. 3 is a plan view of the insulating plate carrying the conductors for the embodiment shown in FIG. 2.

FIG. 3 shows the insulating plate 36 of the embodiment of FIG. 2. In this insulating plate 36 are embedded a first closed wire loop 48, a second closed wire loop 56 and a third open wire loop 64. The first conductor wire 48 passes through the bores 49 to 55, so that at these places galvanic connections can be provided. In a corresponding way, the second conductor wire 56 passes through bores 57 to 63 and the third wire through bores 47 and 65 to 67.

As can also be noted in FIG. 6, the wire conductors in the bores 50 to 55, 58 to 63 and 66 to 67 are brought out in a loop from the bores away from the insulating plate 36.

In the bore 49, a stud or pin (not shown in the drawing) can be inserted that is provided with a groove on its end surface, not shown in the drawing, and there connected with the first embedded wire 48. The beginning and end of the conducting wire 48 in the bore 49 can at the same time be electrically connected together to complete the loop. A stud can be inserted between the cooling bodies 27 and 28, to extend out from the insulating plate 36 and connected with the positive terminal 5. In a corresponding way a second stud can be brought into the bore 57 and connected with the negative terminal, as well as to the beginning and end of the conductor 56. A squeeze-broadened end of the third embedded wire 64 extends into the bore 47 and is there galvanically connected to the angularly extending portion of the foot of the leaf spring 44. The leaf spring 44 can thus be connected with the regulator connection terminal 8. The conducting plate 36 is provided with a raised edge 46 that is interrupted by a multiplicity of pillar-shaped feet 68 to 73 on which the cooling bodies 26 to 28 are riveted.

FIG. 4 is a side view of the rectifier unit embodying the invention illustrated in FIG. 2. The cooling bodies 26 to 28, as they are shown, are bent over at right angles at their circumferential periphery and there formed into claw-like extensions. The surface of the cooling bodies is thus substantially increased, without noticeably increasing the external dimensions of the rectifier unit.

FIG. 5 shows a section along the line A—A of the rectifier unit according to the invention illustrated in FIG. 2. The cooling body 27 is riveted to the foot 70a of the insulating plate 36, so that the foot 70a extends through the cooling body 27 and terminates flush with the far surface of the latter, and the fastening rivet 32 at the surface of the cooling body 27 is insulated from the cooling body 27 by an insulating washer 78. On the underside of the insulating plate 36, the rivet 32 bears on an underlying lock washer 86 that lies against the insulating plate 36. The rivets 29 to 31 and 33 to 35 fasten cooling bodies to the insulating plate in a corresponding way.

The main rectifier diodes 10 to 21 and the exciter field diodes 22 to 24 are equipped with a cylindrical casing that at the end where the diode connection lead 87 comes out is pressed out to form a sort of bead. In the openings of the cooling bodies 26 to 28 that are provided for seating the diodes, the cooling body sheet metal is deformed to push out a collar on what may be regarded as the underside of the cooling plates. The diodes 10 to 21 and the exciter field diodes 22 to 24 are then pressed into these openings from below, so that their annular beads lie flush on the collars provided by deforming the cooling plate sheet metal.

FIG. 5a shows another form of construction of the rectifier unit in which the main diodes 10 to 21 and the exciter field diodes 22 to 24 also have a cylindrical casing, but in which their circumferential beads are provided at the ends opposite to those at which the diode lead wires come out. The cooling body sheet metal is again deformed to provide a collar extending downward in the manner already described, but the diodes 10 to 21 and exciter diodes 22 to 24 are in this case pressed in from above, so that their plane end surfaces beneath the bead or flange structure are flush with the upper surface of the cooling body.

The holes provided in the cooling bodies 26 to 28 for pressing in the main diodes 10 to 21 and the exciter diodes 22 to 24 are so located that when the cooling bodies are riveted into the insulating plate 26, these holes are concentric with the bores 50 to 55, 58 to 63 and 65 to 67 respectively.

FIG. 6 shows a section along the line B—B of the embodiment illustrated in FIG. 2. The diode connection lead 87 of the diode 23 pressed into the cooling body 27 extends carefully through the bore 66 into the loop into which the wire 64 is drawn in the bore 66. The diode connection lead 87 is connected galvanically with the wire 64 in this loop, preferably at a spot weld 88.

FIG. 7 shows a section along the line C—C of the embodiment shown in FIG. 2. The threaded stud 38 has a first threaded section 84, a second segment 95 in the shape of a cylindrical thickening and a third segment of relatively small diameter 85. The threaded stud 38 is first inserted from below through the cooling body 28, so that its first segment 84 passes therethrough, and an insulating washer 92 and an insulating bushing 91 are provided to insulate the threaded stud from the cooling body 28. Another insulating washer 90 is applied from above and the stud is fastened by a nut 83 over a lock washer 89. The third small diameter segment of the stud 38 is surrounded by a hollow rivet 93 and extends through a bore in the insulating plate 86 into a cavity 98. This segment 85 of the stud 38 is preferably deformed by peening into a rivet head 97 over a lock washer 94 in the cavity 98, so that in this manner a rigid connection between the insulating plate 36 and the cooling body 28 can be provided. The cylindrical thickened portion 95 of the stud 38 is provided with a radial bore through which a wire 96 is threaded. The wire 96 is bent over and runs parallel to the diode connection lead 87, so that it can be galvanically connected with it and with the wire 64 that is embedded for most of its course in the insulating plate 36 and serves to connect up the leads of the exciter diodes. Since the wire 64 provides the exciter field d.c. supply voltage, this voltage can be obtained also at the threaded stud 38 through the insulated fastening of the stud 38 on the cooling body 28. The threaded stud 37 is fastened in a similar fashion, but in this case it is screwed down into an electrically connecting joint with the cooling body 26 and has no connection to any of the embedded wires in the insulating plate. The voltage of the phase W of the alternator can be obtained from the stud 37.

The foregoing construction illustrates the small number of parts and the simplicity of assembly of a rectifier unit according to the present invention in which the cooling plates are characteristically connected, not to any d.c. terminal of the unit, but rather to the respective alternating current outputs of the alternator. This construction is of particular advantage where two or more diodes in parallel are used in the main rectifier for each a.c. terminal. As illustrated above, five diodes, four of them main rectifier diodes and one exciter field diode, are mounted on and cooled by each cooling plate. The cooling function is efficiently distributed and is made available to all of the diodes of the rectifier unit and the construction, far from being more complicated, is actually quite simple.

Although the invention has been described with reference to a particular illustrative embodiment, variations are of course possible within the inventive concept.

We claim:

1. Rectifier unit for a 3-phase alternator having three formed metal cooling plates each connected to a different one of the alternating current terminals of said alternator, on which plates diodes are mounted and to which the diodes mounted thereon have one of their terminals connected, and also an insulating plate on which conductor paths for connecting up the diodes are provided and including the improvement, according to the invention, wherein:

there are thermally and electrically connected to each said cooling plate, one exciter field circuit diode, at least one positive side diode and at least one negative side diode, and each of said cooling plates (26,27,28) has the form of a circular sector disk with a claw-like extension at right angles thereto at its outer edge.

2. Rectifier unit as defined in claim 1, in which there are thermally and electrically connected to each said cooling plate (26,27,28) one pair of positive side diodes (15,17;18,19;20,21), one pair of negative side diodes (10,11;12,13;14,15) and one exciter field circuit diode (22,23,24).

3. Rectifier unit as defined in claim 1, in which said insulating plate (36) is made of polyamide synthetic resin material and is shaped essentially in the form of a circular sector with a central aperture with various ridges, perforated bosses and the like thereon and each of said cooling plates (26,27,28) is riveted into a corresponding sector of said insulating plate (36).

4. Rectifier unit as defined in claim 3, in which said insulating plate (36) is provided with a plurality of pillar-like studs (68 to 73) each provided with a central bore and tapered at one end, and in which said pillar-like studs extend into corresponding bores in the cooling plates and terminate flush with the cooling plate surface on the far side of the respective bores, and in which rivets (29 to 35) extend through the bores of said pillar-like studs and are riveted over on insulating washers lying on the surface of the respective cooling bodies and lock washers (86) lying against the insulating plates surrounding the respective bores.

5. Rectifier unit as defined in claim 3, in which said insulating plate (36) has a raised circumferential rim (46) and has a central circular passage opening (99) and in which a collar-like prominence (42) is provided that surrounds said opening (99) for a major portion of its circumference in keyhole shape and defines, at the location at which it leads away from said central opening (99), an approximately rectangular surface of the insulating plate (36) which it accordingly encloses with said central opening, said collar-like prominence (42) at its edge farthest removed from the disk portion of said insulating plate being covered by a sealing member (74).

6. Rectifier unit as defined in claim 3, in which said insulating plate (36) has a plurality of wires (48,56,64) embedded therein, constituting the aforesaid conducting paths, and that these conducting wires are accessible in a multiplicity of bores (47,49 to 55, 57 to 63, 65 to 67) through said insulating plate, said conducting wires (48,56,64) being drawn out of a portion of said bores (50 to 55, 58 to 63, 65 to 67) in the form of loops for facilitating access thereto.

7. Rectifier unit as defined in claim 6, in which a leaf spring (44) is affixed by a stud (45) to said insulating plate (36) and that a foot portion of said leaf spring (44) lying against said insulating plate (36) has an elbowed extension that projects over a bore (47) in said insulating plate (36) and is there galvanically connected with one (64) of said conducting wires embedded in said insulating plate (36), said elbowed extension of the foot portion of said leaf spring (44) lying against a rib (43) formed in said insulating plate (36).

8. Rectifier unit as defined in claim 1, in which each of said positive-side diodes, said negative-side diodes and said exciter field circuit diodes (10 to 24) has a cylindrical casing provided with a bead near the end through which the diode connection leads (87), and in which the diodes are pressed into corresponding openings provided in the cooling plates (26,27,28) from the side on which the cooling plate is later applied and fastened with their respective beads against that side of the cooling plate.

9. Rectifier unit as defined in claim 8, in which the diode lead wires (87) extend through bores (50 to 55, 58 to 63, 65 to 67) in which there is in each case a loop of one of a plurality of wires embedded in said insulating plate (36), the diode lead and the wire loop in each bore being galvanically connected to each other.

10. Rectifier unit as defined in claim 1, in which each of said positive-side diodes, negative-side diodes and exciter field circuit diodes (10 to 24) is provided with a cylindrical housing having a flange or bead at its end opposite to the end through which the diode lead wire (87) is brought out, and in which the diodes are pressed into corresponding bores of the respective cooling plates (26 to 28) from the sides of the cooling plates opposite to that on which said conducting plate is fastened thereto, so that said flange or bead lies against that side of the respective cooling body.

11. Rectifier unit as defined in claim 1, in which a threaded stud (38) is provided having a first section (84) having threads provided thereon, a second section in the shape of a thickened cylindrical portion (95) and a third section (85) of relatively thinner cross-section, compared to the threaded section, and in which said threaded stud is insulated by an insulating disk (92), an insulating bushing (91) and a second insulating disk (90) and is fastened to one of said cooling plates without electrical connection thereto by a nut (83) on said threaded section bearing against the end of said thickened cylindrical section, and in which also said third section (85) of relatively thinner cross-section of said threaded stud (38) is surrounded by a hollow rivet (93) and fastened to said insulating plate (36) by deforming the stud end and the adjoining portion of the hollow rivet over an interposed washer (94), and said thickened cylindrical portion (95) of said threaded stud (38) is provided with a radial bore through which a wire (96) is led that extends to the location of a diode lead wire (87) and is galvanically connected both to said diode lead wire (87) and to a wire (64) embedded in said insulating plate (36) and providing a loop in a bore of said conducting plate through which said diode lead wire (87) projects.

12. Rectifier unit as defined in claim 11, in which a second threaded stud (37) is provided that has a first threaded section, a second cylindrically thickened section and a third section of relatively small diameter, and in which said threaded stud passes through and connects electrically one of said cooling plates other than the one in which said first threaded stud is inserted and is fastened thereto by a nut (82) on its threaded section bearing against said cylindrically thickened section of said stud, and in which also the portion of relatively smaller diameter of said second threaded stud (37) is surrounded by a hollow rivet and extends, along with said hollow rivet through a bore in said insulating plate (36) and is fastened to said insulating plate by deforming the end of said stud and that of said hollow rivet over an underlying washer bearing against said insulating plate, said second threaded stud being connected to an output terminal for providing alternator speed information.

13. Rectifier unit as defined in claim 12, in which a pair of connection studs having a groove in the end surface thereof, are provided mounted perpendicularly to said insulating plate (36) in bores (49,57) through said insulating plate and in said bores are galvanically connected with the beginning and end of substantially circular wires (48,56) embedded in said insulating plate, each of which are connected to the lead wires of a plurality of diodes, each of said connection studs being connected with one of the d.c. output terminals (5,6) of the rectifier unit.

14. Rectifier unit as defined in claim 1, in which one of said cooling plates is connected to an output terminal (9) for providing alternator speed information.

* * * * *